United States Patent [19]

Lu

[11] Patent Number: 4,933,297
[45] Date of Patent: Jun. 12, 1990

[54] METHOD FOR ETCHING WINDOWS HAVING DIFFERENT DEPTHS

[75] Inventor: Chih-Yuan Lu, Lower Macungie Township, Lehigh County, Pa.

[73] Assignee: AT&T Bell Laboratories, Murray Hill, N.J.

[21] Appl. No.: 420,788

[22] Filed: Oct. 12, 1989

[51] Int. Cl.$^5$ .......................................... H01L 21/265
[52] U.S. Cl. ...................... 437/41; 437/192; 437/193; 437/56; 437/57
[58] Field of Search ............... 437/192, 56, 193, 57

[56] References Cited

U.S. PATENT DOCUMENTS

| | | | |
|---|---|---|---|
| 3,810,795 | 5/1974 | Troutman | 437/192 |
| 4,382,827 | 5/1983 | Romano-Moran et al. | 437/56 |
| 4,392,150 | 7/1983 | Courreges | 437/192 |
| 4,442,591 | 4/1984 | Haken | 437/56 |
| 4,455,737 | 6/1984 | Godejahn | 437/193 |
| 4,628,590 | 12/1986 | Udo et al. | 437/192 |
| 4,734,383 | 3/1988 | Ikeda et al. | 437/57 |

FOREIGN PATENT DOCUMENTS

| | | | |
|---|---|---|---|
| 0285410 | 10/1988 | European Pat. Off. | 437/192 |
| 0133550 | 6/1988 | Japan | 437/192 |
| 0133551 | 6/1988 | Japan | 437/192 |
| 0011346 | 1/1989 | Japan | 437/193 |

Primary Examiner—Brian E. Hearn
Assistant Examiner—Trung Dang
Attorney, Agent, or Firm—Richard D. Laumann

[57] ABSTRACT

Overetching of gate runners, which may be silicided, during window etching is prevented by opening windows in the dielectric to expose the top of the silicide layer on the runners and then depositing a metal, such as tungsten, which has a high etch selectivity with respect to the dielectric. Etching can then continue to open windows which expose the source/drain regions without overetching of the gate runners because the etch used has high selectivity with respect to the dielectric and the metal.

6 Claims, 1 Drawing Sheet

METHOD FOR ETCHING WINDOWS HAVING DIFFERENT DEPTHS

TECHNICAL FIELD

This invention relates to a method of manufacturing integrated circuits having windows of different depths.

BACKGROUND OF THE INVENTION

Integrated circuit technology has progressed to the point where some components of the most technologically sophisticated silicon integrated circuits have dimensions less then one micrometer. As will be readily appreciated by those skilled in the art, dimensions this small permit a relatively large number of devices to be fabricated per unit area on a silicon wafer, and also facilitate fabrication of circuits with a large number of components. Devices are generally electrically contacted through openings, commonly referred to as windows, formed in a dielectric layer overlying a substrate. The term, "substrate," is used to mean material which lies beneath and supports another material. However, as the number of devices increases, the difficulties associated with electrically contacting the devices also increase because of the need to make the electrical contact areas as small as possible and because of the large number of contacts required.

One approach to making electrical contacts at the submicrometer wafer level uses metallizations on several levels with each level of interconnection being on a dielectric, e.g., oxide, layer. However, placing metal interconnections on the dielectric generally requires that the dielectric layer be planarized before the metallization is performed. Thus, this approach simplifies the problem of making electrical connections but creates another problem as will be evident from the following considerations. The windows for the gate contacts and the windows for the source and drain contacts are generally etched through a dielectric layer at the same time. However, the top of the gate is further from the substrate than are the source and drain regions. Thus, the height of the planarized dielectric over the gate is less than is the height of the planarized dielectric over the source and drain regions. The difference in heights may be as much as, for example, 500 nm to 800 nm. Consequently, overetching of the gate occurs in order to etch through the dielectric to the source and drain regions. Moreover, it is critical to open all windows to the source and drain regions, and a slight overetch of the source and drain regions is required to compensate for non-uniformities in the dielectric layer thickness, as well as for non-uniformities in the etching process to ensure opening of all windows. The overetch of the source and drain regions necessarily further overetches the gate windows as well.

However, there is frequently a limit on the permissible overetch of the gate structure. For example, self-aligned silicides, i.e., salicides, are frequently used over polysilicon in the gate structure to, for example, increase electrical conductivity. The salicide is typically approximately 40 nm to 100 nm thick and, to retain the beneficial characteristics of the salicide, no more than fifty percent of it should be removed during the etching process. A typical overetch of the dielectric to ensure opening of the source and drain windows is approximately fifty percent. These three constraints require the window etch to have a selectivity of, at least, approximately 30:1, and preferably 60:1, for the ratio of the dielectric-to-silicide etch. Those skilled in the art will realize that finding an etch having this degree of selectivity represents a formidable task. Of course, generally similar considerations apply if the gate structure is all polysilicon; i.e., a significant overetch of the polysilicon is undesirable.

An alternative to finding such a highly selective etch coats the top of the gate electrode with an insulating, such as nitride, layer. However, this approach is disadvantageous because the nitride-to-oxide etch selectivity is generally not large; e.g., 2:1 to 5:1, and is usually less uniform over the wafer as the selectivity becomes greater. As discussed in the last paragraph, a larger etch selectivity is desirable. Additionally, many phosphorus-doped dielectrics getter contaminants, and the nitride may impair the effectiveness of the getting process.

SUMMARY OF THE INVENTION

A method of integrated circuit manufacture is described in which windows of different depths are opened to expose selected portions of a substrate by forming a planar layer of dielectric material on a substrate, etching the dielectric material to form first windows which expose portion of the substrate, and to partly etch second windows, selectively depositing a conductive material on the bottom of the first windows, and etching said dielectric until the second windows are open; i.e., expose portions of said substrate. The second windows are deeper than are the first windows. The deposited conductive material has a high etching selectivity with respect to the dielectric materials. The etching selectivity prevents significant overetching of the material at the bottom of the first windows. In one preferred embodiment, the first and second windows expose selected portions of gate runners on the field oxide, and selected portions of source/drain regions, respectively. In another preferred embodiment, the deposited material is a metal.

DETAILED DESCRIPTION

Figure 1:
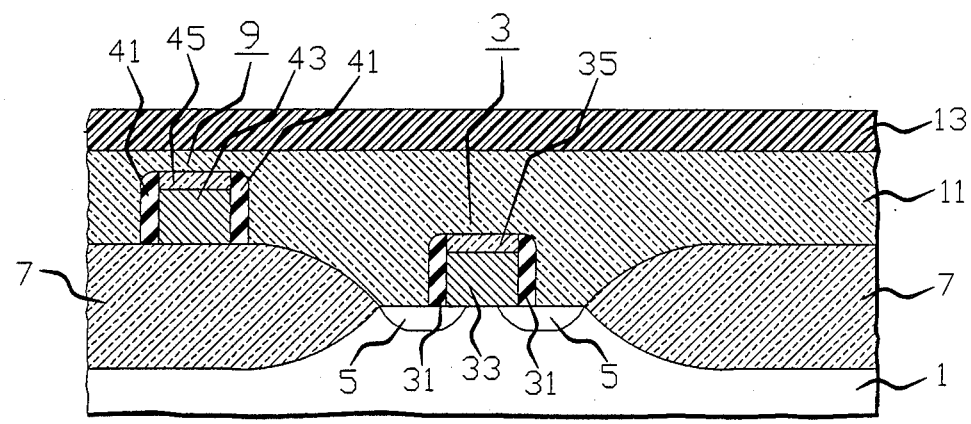
FIGS. 1 and 2 are sectional views of devices of an integrated circuit at intermediate stages of fabrication according to the method of this invention. For reasons of clarity, the elements depicted are not drawn to scale.

A sectional view of an integrated circuit, fabricated according to this invention, at an intermediate stage of fabrication is depicted in FIG. 1. Shown are substrate 1, and disposed thereover; gate electrode structure 3; source and drain regions 5, field oxide regions 7; gate runner 9 on the field oxide region; dielectric layer 11; and photoresist 13. As depicted, the source and drain regions are on opposite sides of the gate electrode structure. The gate structure 3 has insulating sidewalls 31, polysilicon layer 33, and silicide layer 35. Layers 33 and 35 are sequentially disposed over the substrate; i.e., layer 33 is nearer the substrate than is layer 35. The gate runner has components 41, 43, and 45, which are analogous to components 31, 33, and 35, respectively, of the gate. The gate runner depicted is connected to another device (not depicted), which is either above or below the plane of the figure.

The structure depicted is fabricated with techniques that are well known to those skilled in the art and which, accordingly, need not be described in detail. For example, forming a planar layer of dielectric material may be accomplished by depositing the material and then planarizing it using well-known techniques. At its thickest point, dielectric layer 11 is about 1200 nm thick. The dielectric is about 500 nm thick at its thinnest point. As is evident, the dielectric material is thicker over the source/drain regions than it is over the gate runners. It is typically a silica-based glass. The silicide on the gate is formed by conventional techniques and is approximately 60 nm thick. Other thicknesses and materials may be used as will be readily appreciated by those skilled in the art.

However, the following points about the fabrication sequence should be noted in more detail. After windows for the electrical contacts are opened in the resist using standard lithographic techniques, etching of the dielectric begins with a standard etch having a reasonable oxide to silicide selectivity. A reasonable selectivity is in 10:1 or 15:1. This window etch is continued until the first windows on the gate runner are opened. The second windows which will ultimately expose the source/drain regions are partly etched. The end point is detected using well-known techniques. Some overetch is desirable to ensure that all windows on all gate runners are entirely opened. The amount of overetch is likely to be only 20 nm to 30 nm of silicide, and is less than half of the total amount of silicide. The small amount of overetching of the silicide will not result in the opening of any of the windows to the source and drain regions, considering the different depths and the etching selectivity.

A metal or other conductive material is now selectively deposited on the exposed portions of the gate runner; i.e., on the bottoms of the first windows. A typical metal is tungsten which is easily deposited selectively using techniques that are well-known to those skilled in the art. The selective tungsten thickness is not critical, and a layer between 20 nm and 50 nm thick is sufficient.

Selective deposition of tungsten on the gate runners only has several advantages, as contrasted to selective deposition on both the gate runners and the source/drain regions. First, it is difficult to simultaneously satisfy the requirements for low-contact resistance and low-junction leakage for the source/drain regions. The junction leakage problem does not exist for the gate runners. Second, tungsten has very high selectivity to the oxide etch which is used to complete window fabrication. Therefore, when the etch is continued to open the second windows for the source/drain regions, the tungsten acts as a very effective etch stop for the gate runners and prevents further etching of the gate structure.

Figure 2:
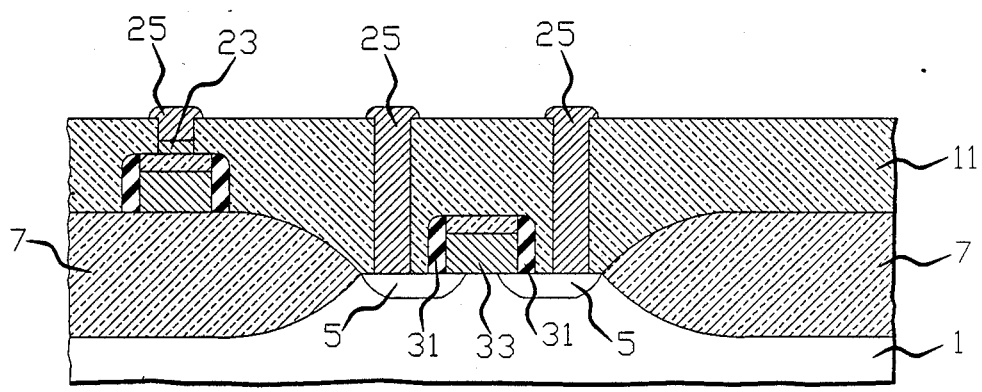

After tungsten deposition is completed, etching of the second windows for the source/drain regions resumes and the structure depicted in FIG. 2 is ultimately obtained. Depicted, in addition to elements depicted in FIG. 1, are tungsten layer 23 on the gate runner and metallizations 25. As can be seen, the source/drain regions are exposed by the second windows prior to the metallization. Metallizations 25 for all windows are performed using techniques well known to those skilled in the art.

Alternatives to the embodiment described are contemplated. For example, a somewhat thicker dielectric layer, approximately 1500 nm, may be deposited and, after etching the first windows for the gate runners with the window photo-resist on, the window etching is terminated and the photoresist is stripped off. The wafer is then put into a selective tungsten deposition reactor and tungsten is selectively deposited on the exposed window areas of the gate runners. The wafer is then returned to the oxide etcher, and the window formation is completed. Although the final oxide etch is performed with a non-masking etch, the initial dielectric thickness is sufficient so that the final oxide thickness is the same as it would have been if the photoresist had remained for the final etch, as previously described. Another embodiment deposits a thin layer of silicon nitride, e.g. 20 nm to 30 nm, after the dielectric layer has been planarized to the desired thickness. The silicon nitride, i.e., second dielectric layer, is then lithographically patterned and selectively etched using a photoresist mask. After the nitride layer has been etched, the etching chemistry is switched to an etching chemistry which will etch the first dielectric layer. This etching chemistry is continued until all window openings on the gate runners are opened. The photoresist is then stripped and the wafer placed into a selective tungsten deposition reactor. Tungsten is selectively deposited on the portions of the gate runners exposed by the window openings. After tungsten deposition, the window etch is continued using the nitride as an etch mask. The selective tungsten will also, of course, serve as an etch stop in the gate runner window. If desired, the nitride layer can be stripped away after the windows in the source/drain region have been opened.

A metal need not be deposited on the bottom of the shallower, i.e., first window. Any conductive material that can be deposited selectively and which has a high etch selectively with respect to the dielectric can be deposited. Other variations will be readily thought of by those skilled in the art.

I claim:

1. A method of integrated circuit manufacture, in which windows of different heights are opened to expose selected portions of a substrate, comprising the steps of:
   forming a planar layer of dielectric material on a substrate;
   etching said dielectric material to open first windows which expose portions of said substrate and to partly etch second windows;
   selectively depositing a conductive material on the bottom of said first windows, said material having a high etch selectivity with respect to said dielectric; and,
   etching said dielectric to open said second windows, said second windows being deeper than said first windows, which expose further portions of said substrate.

2. A method as recited in claim 1 in which said substrate comprises gate runners on a field oxide and a device region, including source and drain regions, said dielectric material being thicker over said source and drain regions than over said gate runners, said first windows exposing gate runners and said second windows exposing source and drain regions.

3. A method as recited in claim 2 in which said selectively deposited material comprises a metal.

4. A method as recited in claim 3 in which said metal comprises tungsten.

5. A method as recited in claim 1 in which said dielectric comprises a silicon oxide.

6. A method as recited in claim 5 comprising the further step of depositing and patterning a layer of silicon nitride on said silicon oxide prior to said etching said silicon oxide.

* * * * *